United States Patent [19]

Yanai

[11] Patent Number: 5,239,206
[45] Date of Patent: Aug. 24, 1993

[54] SYNCHRONOUS CIRCUIT WITH CLOCK SKEW COMPENSATING FUNCTION AND CIRCUITS UTILIZING SAME

[75] Inventor: Akihiro Yanai, Isehara, Japan

[73] Assignee: Advanced Micro Devices, Inc., Sunnyvale, Calif.

[21] Appl. No.: 914,053

[22] Filed: Jul. 13, 1992

Related U.S. Application Data

[63] Continuation of Ser. No. 664,212, Mar. 4, 1991, abandoned.

[30] Foreign Application Priority Data

Mar. 6, 1990 [JP] Japan ................. 2-54785

[51] Int. Cl.⁵ ............... H03K 3/356; H03K 17/22; H03K 5/13
[52] U.S. Cl. ............... 307/272.2; 307/269; 307/272.3; 307/279; 307/572; 307/603; 377/79
[58] Field of Search ............... 307/272.2, 271, 272.3, 307/279, 456, 479, 270, 606, 562, 572, 529, 608, 269, 603; 377/77, 78, 79

[56] References Cited

U.S. PATENT DOCUMENTS

| | | |
|---|---|---|
| 3,588,527 | 6/1971 | Cricchi .................... 377/79 |
| 3,812,384 | 5/1974 | Skorup ................... 307/272.3 |
| 4,103,185 | 7/1978 | Denes ..................... 307/279 |
| 4,275,316 | 6/1981 | Knapp ..................... 307/279 |
| 4,495,629 | 1/1985 | Zasio et al. .............. 307/272.2 |
| 4,554,467 | 11/1985 | Vaughn .................. 307/279 |
| 4,667,339 | 5/1987 | Tubbs et al. ............. 307/272.2 |
| 4,691,122 | 9/1987 | Schnizlein et al. ...... 307/272.2 |
| 4,733,405 | 3/1988 | Shimizume et al. ..... 307/279 |
| 4,843,254 | 6/1989 | Motegi et al. ........... 307/279 |
| 4,974,241 | 11/1990 | McClure et al. ........ 307/279 |
| 5,015,875 | 5/1991 | Giles et al. ............. 307/272.2 |
| 5,118,975 | 6/1992 | Hillis et al. ............. 307/602 |

FOREIGN PATENT DOCUMENTS

| | | | |
|---|---|---|---|
| 0260421 | 11/1987 | Japan .................. | 307/272.2 |
| 0016710 | 1/1988 | Japan .................. | 307/272.2 |
| 0067011 | 3/1988 | Japan .................. | 307/272.3 |
| 0209212 | 8/1988 | Japan .................. | 307/272.2 |
| 0158817 | 6/1989 | Japan .................. | 307/272.2 |
| 0104016 | 4/1990 | Japan .................. | 307/272.2 |

Primary Examiner—William L. Sikes
Assistant Examiner—Terry D. Cunningham
Attorney, Agent, or Firm—Fliesler, Dubb, Meyer & Lovejoy

[57] ABSTRACT

Disclosed here are D-type flipflops cascaded in a semicustom LSI such as a standard cell or a gate array. Clock signals supplied to each of the flipflops have phases different from each other due to clock skew. A signal indicative of a data signal holding in the flipflop in one stage is applied to the flipflop in the preceding stage. The flipflop in the preceding stage is responsive to the applied signal for allowing a data signal held in a master latch to be transmitted to a slave latch. As a result, the passing through of data which might be possibly caused by the clock skew can be prevented. In other words, the passing of a data signal through two flipflops during one clock cycle can be prevented.

14 Claims, 6 Drawing Sheets

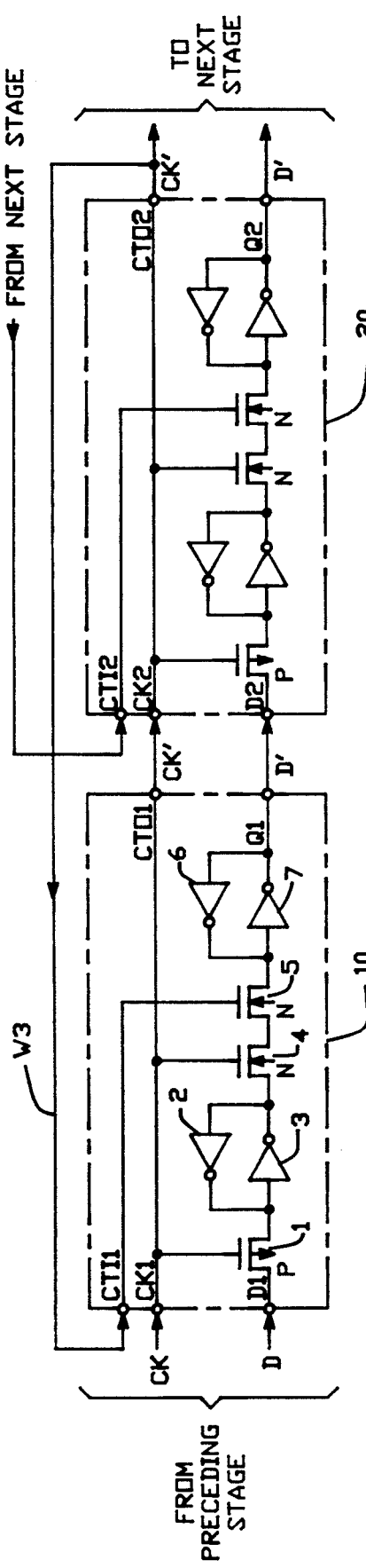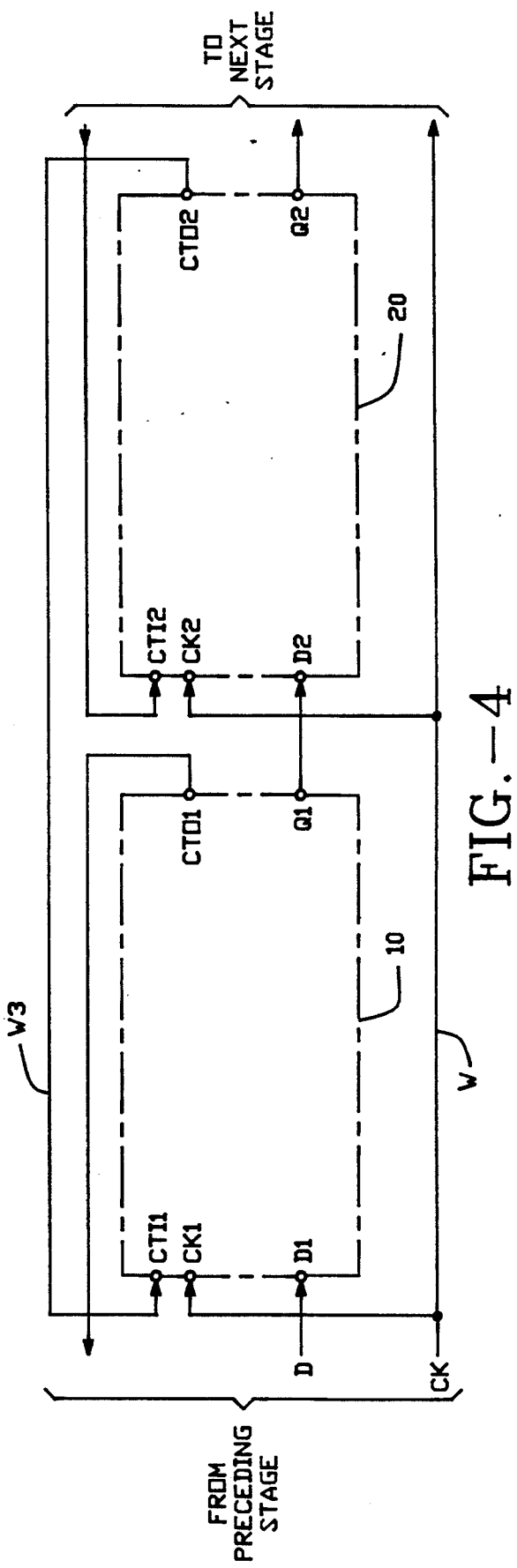
FIG.-1
FIG.-4

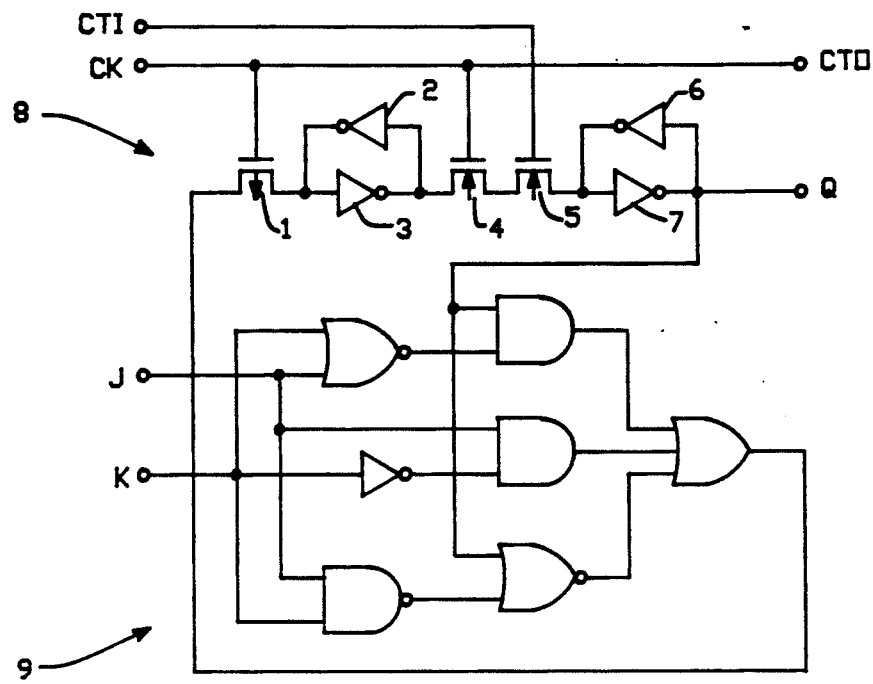
FIG.−7
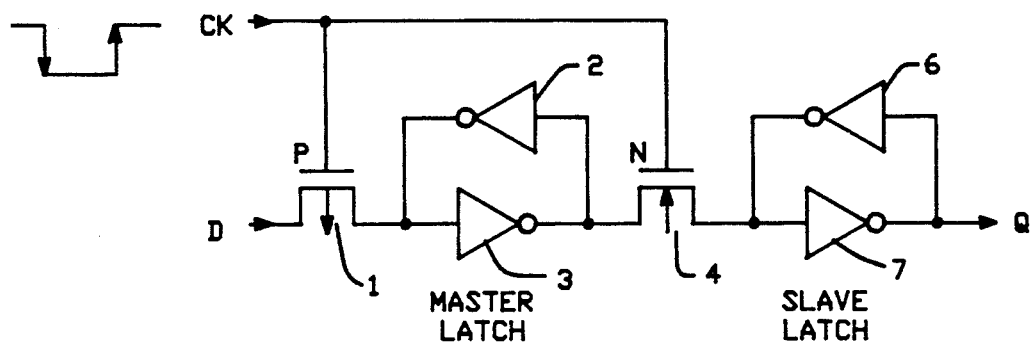
(PRIOR ART)
FIG.−9

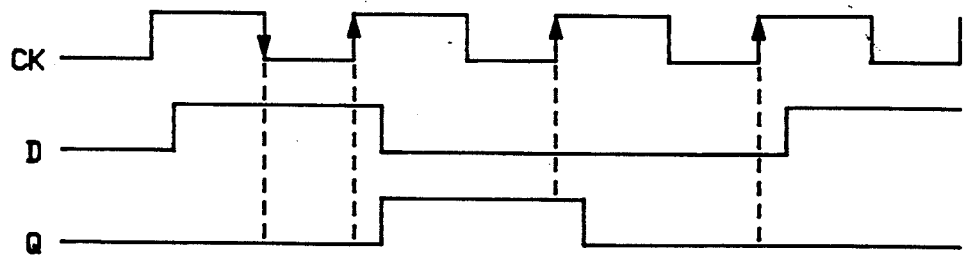
(PRIOR ART)
FIG.—10
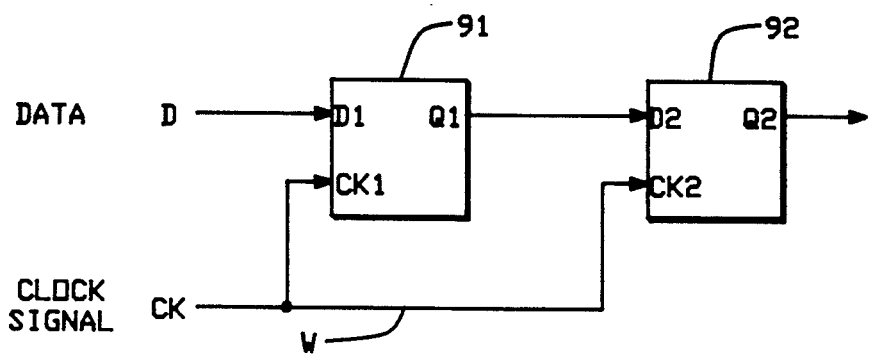
(PRIOR ART)
FIG.—11
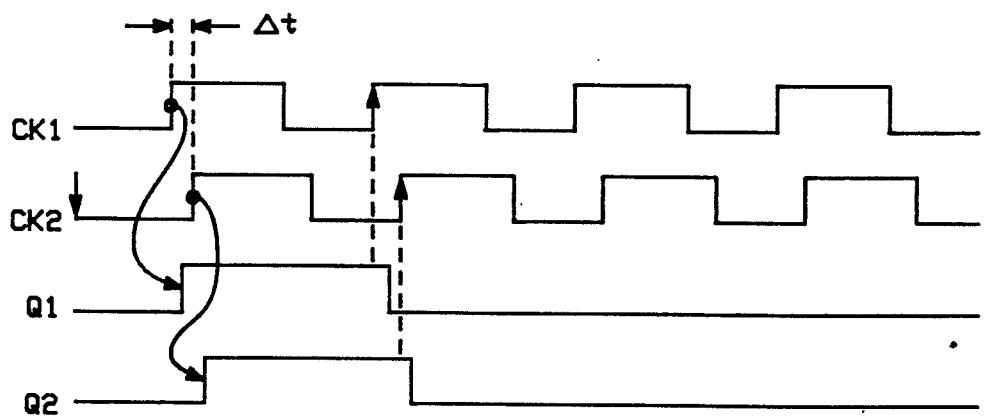
(PRIOR ART)
FIG.—12

SYNCHRONOUS CIRCUIT WITH CLOCK SKEW COMPENSATING FUNCTION AND CIRCUITS UTILIZING SAME

This application is a continuation of Ser. No. 07/664,212, filed Mar. 4, 1991, now abandoned.

CROSS-REFERENCE TO RELATED APPLICATION(S)

This application claims priority to Japanese Patent Application Serial No. 02-54785, filed Mar. 6, 1990, inventor Akihiro Yanai.

BACKGROUND OF THE INVENTION

1. Field of the Invention

The invention relates generally to delay circuits, and more particularly, to a delay circuit for delaying the supplied signal in response to the clock signal with high reliability.

2. Description of the Related Art

In the design of semi-customized LSI such as standard cells and gate arrays, computer aided design (hereinafter referred to as "CAD") is widely used. For example, a circuit block cell having standard features is previously prepared to be previously registered in a library under the standard cell method. With the CAD system, the desired circuit block cells are automatically arranged and wired in accordance with an automatic arrangement wiring program. In the execution of the automatic arrangement wiring program, the area for arrangement of the wiring is used as effectively as possible to minimize the occupying area of the circuit. As a result, it is seldom that the length of the wiring is designed to be minimum.

However, the delay caused by the wiring for connecting elements has recently evolved into a problem that cannot be ignored as the rapid operation of semiconductor integrated circuits advances. Under such a circumstance, the problem set forth hereinafter occurs when more than one master slave type flipflops are cascaded. In the following description, a delay type (hereinafter referred to as "D-type") flipflop is adopted as an example of a master slave type flipflop.

FIG. 8 is a simplified block diagram of a gate array. Referring to FIG. 8, the gate array comprises an input/output pad 30 for externally inputting/outputting signals, and base cell columns 31 and 32. Five D-type flipflops 91-95 are implemented using the base cell column. The five flipflops 91-95 are connected in cascade to each other by a wiring (not shown) to construct a shift register having five stages. The wiring path to interconnect each of the flipflops is determined by carrying out the automatic arrangement wiring program provided within the CAD system.

FIG. 9 is a circuit diagram of a conventional D-type flipflop. A D-type flipflop has the most simple circuit configuration among the numerous master slave type flipflops. Referring to FIG. 9, the D-type flipflop comprises inverters 2 and 3 forming the master latch, and inverters 6 and 7 forming the slave latch. A PMOS transistor 1 is connected for the purpose of input control of the master latch. For the output control of the master latch, a NMOS transistor 4 is connected. Transistors 1 and 4 operate in response to clock signal CK. Data D applied to the D-type flipflop is provided as the output data Q with a delay defined by the frequency of the clock signal CK.

FIG. 10 is a timing diagram for explaining the operation of the circuit shown in FIG. 9. In operation, input data D is sampled and held in the master latch formed by inverters 2 and 3 in response to the fall and subsequent rise of the clock signal CK. Since the transistor 4 is turned on in response to the high level of the clock signal CK, the data signal held within the master latch is provided to the slave latch formed by inverters 6 and 7. As a result, the output data signal Q is provided via the slave latch.

FIG. 11 is a circuit diagram showing the circuit connection when two D-type flipflops are cascaded. FIG. 12 is a timing diagram for explaining the operation. It should be noted in FIG. 12 that the clock signal CK2 applied to the flipflop 92 is delayed by $\Delta t$ with respect to the clock signal CK1 applied to flipflop 91 by clock skew. This delay time $\Delta t$ may be caused by arranging and wiring the two flipflops 9 and 92 in accordance with the automatic arrangement wiring program of the above mentioned CAD system. That is, the flipflop 92 is connected so as to receive the clock signal CK via a wiring W longer than the flipflop 91 to cause the delay time at called clock skew.

PROBLEMS TO BE SOLVED BY THE INVENTION

As shown in FIG. 12, the flipflop 91 establishes an output data signal Q1 in response to the fall and subsequent rise of the clock signal CK1. In the embodiment, a high level data signal Q1 is provided. When data signal Q1 rises, Q1 rises as a result of clock signal CK1 being raised, the clock signal CK2 is not yet raised because, the clock signal CK2 is delayed. This causes the raised high data signal Q1 to be sampled in the flipflop 92 clock signal CK2 rises after A1 rises. As a result, a high data signal Q1 from the flipflop 91 is provided as data signal Q2 from the flipflop 92 in response to the same rise of the clock signal CK. In other words, data D passes through two flipflops 91 and 92 within one clock period, i.e., the "passing through of data" is occurring. This means that the desired delaying operation by two D-type flipflops 91 and 92 is suppressed to become the direct cause of malfunction of the circuit comprising these flipflops The present invention is provided to solve the above-described problem with the object of reliably delaying the applied signal in response to the clock signal in the delay circuit.

SUMMARY OF THE INVENTION

The delay circuit in accordance with the present invention comprises first and second cascaded holding means each responsive to clock signals for holding applied data signals, signal line means for applying the clock signal provided to the first holding means to the second holding means with delay, and transmitting means for transmitting the data signal held in the first holding means to the second holding means in response to the holding of the second holding means.

Function

In the delay circuit of the present invention, since the transmitting means supplies the data signal held in the first holding means to the second holding means in response to the holding of the second holding means, the passing through of the data signal is prevented even when the timing of the clock signal applied to each of the first and second holding means deviates from each other.

BRIEF DESCRIPTION OF THE DRAWINGS

FIG. 1 is a circuit diagram of D-type flipflops shown an embodiment of the present invention.

FIG. 4 is a block diagram of the circuit shown in FIG. 1.

FIG. 7 is a circuit diagram showing an embodiment of an application of the present invention to a JK flipflop.

FIG. 9 is a circuit diagram of a conventional D-type flipflop.

FIG. 10 is a timing diagram for explaining the operation of the circuit shown in FIG. 9.

FIG. 11 is a circuit diagram showing the circuit connection of conventional cascaded D-type flipflop.

FIG. 12 is a timing diagram for explaining the operation of the circuit shown in FIG. 11.

Figure 2:
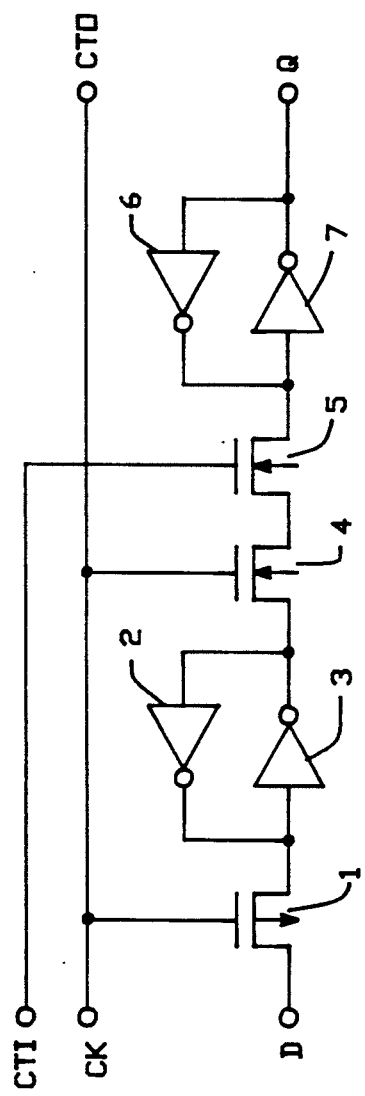
FIG. 2 is a circuit diagram of the D-type flipflop shown in FIG. 1.

In the drawings, 1 is a PMOS transistor, 2, 3, 6, 7 are inverters, 4 and 5 are NMOS transistors.

DESCRIPTION OF THE PREFERRED EMBODIMENT

FIG. 2 is a circuit diagram showing an improved D-type flipflop employed in one embodiment of the invention. The D-type flipflop shown in FIG. 2 has a NMOS transistor 5 provided between the transistor 4 and the slave latch in comparison with the conventional flipflop shown in FIG. 9. The transistor 5 operates in response to the signal CTI which indicates the holding in the next stage circuit connected to receive the output data signal Q.

Figure 3:
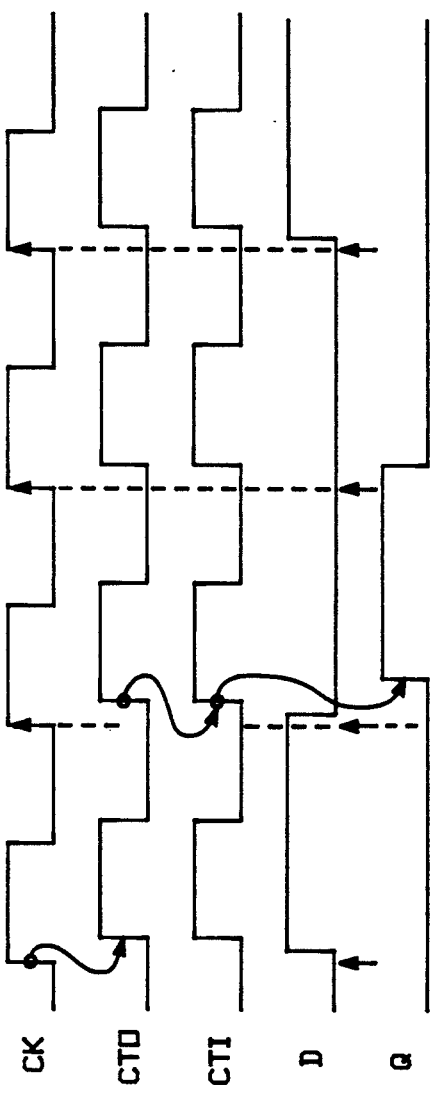
FIG. 3 is a timing diagram for explaining the operation of the circuit shown in FIG. 2.

FIG. 3 is a timing diagram for explaining the operation of the circuit shown in FIG. 2. In operation, since the PMOS transistor 1 is turned on in response to the fall of the clock signal CK, the input data signal D is held within the master latch formed by the inverters 2 and 3. The transistor 4 is also turned on in response to the rise of the clock signal CK. However, since a transistor 5 is connected between the transistor 4 and the slave latch, the timing of the application of the data signal held in the master latch to the slave latch is controlled by the signal CTI. Therefore, the data signal held in the master latch is applied to the slave latch via transistors 4 and 5 in response to the rise of the signal CTI.

FIG. is a circuit diagram of a cascaded D-type flipflop showing an embodiment of the invention. Referring to FIG. 1, flipflops 10 and 20 having the same circuit configuration of the D-type flipflop shown in FIG. 2 are cascaded. Flipflop 10 is connected so as to receive the clock signal transmitted via the flipflop 20, i.e., to receive the signal CTO2 as the signal CTI1 via the wiring W3. This causes the transistor 5 in flipflop 10 to be turned on after data is held within the master latch in flipflop 20. The circuit connection of FIG. 1 is shown as a block diagram in FIG. 4.

Figure 5:
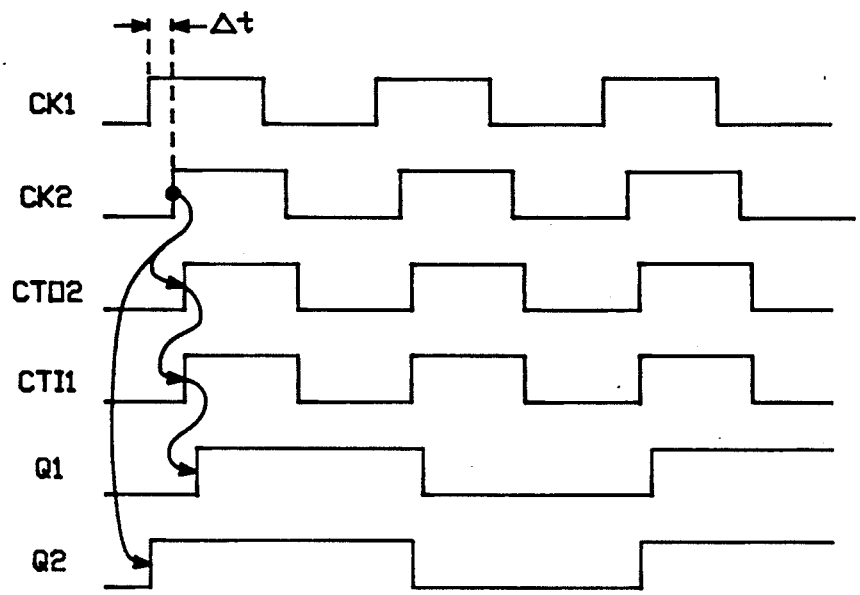
FIG. 5 is a timing diagram for explaining the operation of the circuit shown in FIG. 1.

Referring to the timing diagram of FIG. 5, the operation of the circuit shown in FIG. will be explained. Since the clock signal CK is provided to each flipflop 10 and 20 via the wiring W of FIG. 4, the clock signal CK2 provided to the flipflop 20 is delayed by Δt with respect to the clock signal CK1 by clock skew. However, the signal CTO2 provided via the flipflop 20 is further delayed than the clock signal CK2. Since the clock signal CTI1 provided to the transistor 5 in flipflop 10 is simultaneous or delayed with respect to the signal CTO2, the rise of the data signal Q1, i.e., the output of the flipflop 10 is provided after the rise of the clock signal CK2. In other words, after the previous data D2 is held within the master latch of the flipflop 20, the transistor 5 of the flipflop 10 is turned on to output the data signal Q1. Consequently, it is understood that the "passing through of data" phenomenon in conventional circuits described in conjunction with FIG. 12 may be reliably prevented.

Figure 6:
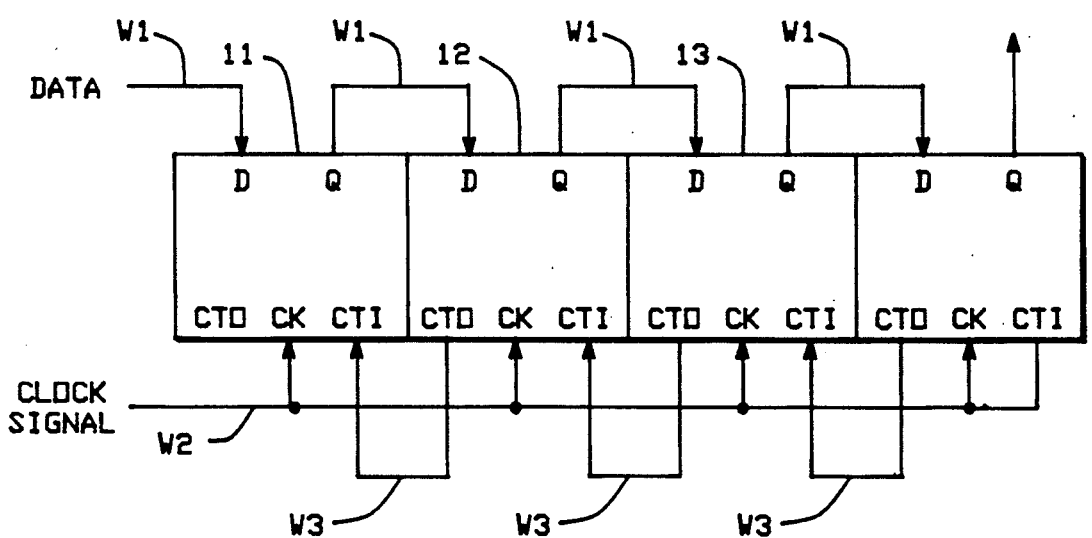
FIG. 6 is a wiring block diagram of an application of the present invention to standard cells.
Figure 8:
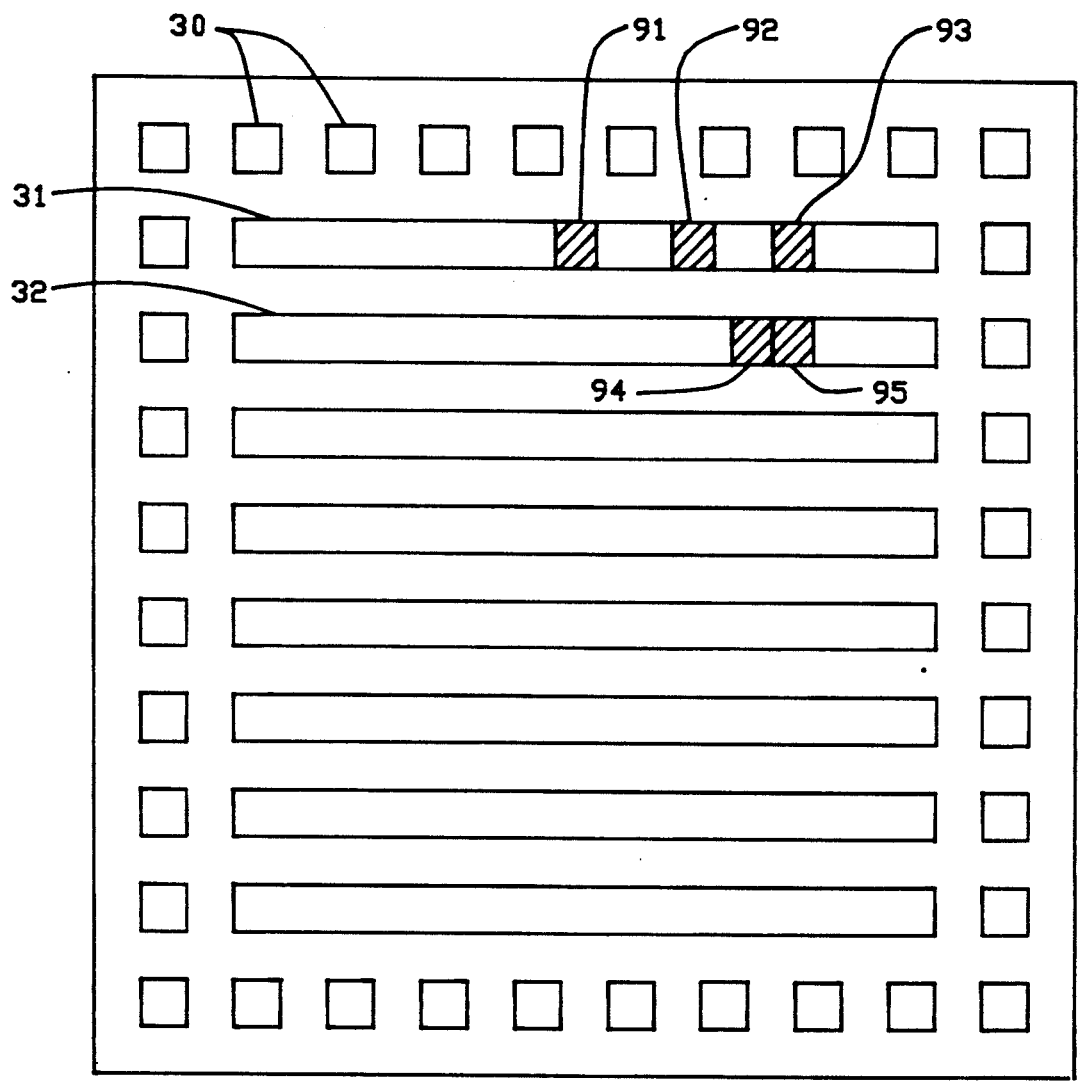
FIG. 8 is a block diagram of a simplified gate array.

An embodiment of a standard cell employed in the present invention is shown in FIG. 6. Referring to FIG. 6, standard cells 11-14 forming a D-type flipflop are cascaded by wiring W1, W2 and W3. Each wiring W1 connects the input/output of each standard cell 11-14. The wiring W2 provides the clock signals to each standard cell 11-14. Each wiring W3 transmits the signal indicating the holding of the master latch in each later stage flipflop to each prior stage flipflop as signal CTI.

The above description has been accomplished where the present invention is applied to D-type flipflop as an example. It is noted that a circuit having master slave-type flipflops cascaded is also applicable. For example, an application of the present invention to a JK flipflop is shown in FIG. 7. The JK flipflop comprises a D-type flipflop portion 8 and a logical gate portion 9. The logical gate portion 9 includes a logical circuit necessary to form a JK flipflop.

Effect of the Invention

In accordance with the present invention, transmitting means for transmitting the data signal held in the first holding means to the second holding means in response to the holding of the second holding means is provided to obtain a delay circuit which can reliably delay the applied data signal in response to the clock signal.

What is claimed is:

1. A synchronous circuit with a clock skew compensating function, said synchronous circuit comprising:
   a master latch having a corresponding master data input and master data output;
   a slave latch having a corresponding slave data input and slave data output;
   first coupling means, responding to a first lock signal, for selectively applying a first data signal to the master data input of the master latch in synchronism with the first clock signal;
   second coupling means, for coupling a master output signal developed at the master data output of the master latch to the slave data input of the slave latch;
   third coupling means, coupled between the second coupling means and the slave latch responding to a second clock signal, for temporarily blocking the master output signal from reaching the slave data input;

a first wire for coupling a slave output signal developed at the slave data output to a subsequent circuit;

a second wire, receiving said first clock signal for introducing a time delay to the first clock signal thereby developing a delayed version of the first clock signal, said second wire providing the delayed version of the first clock signal to the subsequent circuit; and a third wire for returning the delayed version of the first clock signal to the third coupling means as said second clock signal.

2. The synchronous circuit of claim 1 wherein the second coupling means includes switch means, responding to the first clock signal, for selectively passing the master output signal developed at the master data output of the master latch to the third coupling means in synchronism with the first clock signal.

3. The synchronous circuit of claim 1 or 2 where said subsequent circuit is a second synchronous circuit according to claim 1.

4. The synchronous circuit of claim 1 where said synchronous circuit and said subsequent circuit are defined on an integrated circuit.

5. The synchronous circuit of claim 1 where said synchronous circuit and a subsequent circuit are cascaded flip flops forming part of a shift register.

6. The synchronous circuit of claim 1 where said synchronous circuit further comprises:

logical gate circuitry receiving J and K inputs and the slave data output, said logical gate circuitry supplying the first data signal to the first coupling means to form a JK type flip flop.

7. The synchronous circuit of claim 1 where said synchronous circuit is a D type flip flop.

8. The synchronous circuit of claim 1 wherein:

the first coupling means includes a first transistor of a first conductivity type controlled by the first clock signal;

the second coupling means includes a second transistor of a second conductivity type controlled by the first clock signal; and the third coupling means includes a third transistor of said second conductivity type controlled by the second clock signal.

9. The synchronous circuit of claim 8 wherein the first transistor is a PMOS transistor, the second transistor is a NMOS transistor, and the third transistor is a NMOS transistor.

10. The synchronous circuit of claim 8 wherein:

the master latch includes a first inverter having an input and an output, and a second inverter having an input and an output respectively coupled to the output and input of the first inverter; and the slave latch includes a third inverter having an input and an output, an da fourth inverter having an input and an output respectively coupled to the output and input of the third inverter.

11. A synchronous system with a clock skew compensating function comprising:

a first synchronous circuit unit having a first data input node, a first clock input node, a time-delayed clock input node, and a first data output node, where the first synchronous circuit unit processes a first data signal presented at the first data input node when a first clock signal is received at the corresponding first clock input node;

a second synchronous circuit unit having a second data input node, a second clock input node, a second data output node, and a time-delayed clock output node, where the second synchronous circuit unit processes a second data signal presented at the second data input node when a second clock signal is received at the corresponding second clock input node and where the time-delayed clock output node outputs an indicating signal that indicates receipt of the second clock signal by the second synchronous circuit unit;

a first wire of predetermined length coupling the first data output node to the second data input node;

a second wire of predetermined length coupling the first clock input node to the second clock input node, the length of said second wire causing the second clock signal to be time-delayed relative to the first clock signal; and a third wire coupling the time-delayed clock output node of the second synchronous circuit unit to the time-delayed clock input node of the first synchronous circuit unit;

wherein said first synchronous circuit unit includes output delay means, responsive to the indicating signal, for delaying production of an output signal at the first data output node until said output delay means receives the indicating signal.

12. A synchronous system according to claim 11 wherein the first synchronous circuit unit and the second synchronous circuit unit are defined in spaced-apart areas of an integrated circuit.

13. A synchronous system according to claim 11 wherein the first synchronous circuit unit and the second synchronous circuit unit define parts of spaced-apart or adjacent cells in a gate array integrated circuit.

14. A clock skew compensating method for a synchronous system having first and second circuit units connected in sequence where the second circuit unit receives a wire-length delayed clock signal after the first circuit unit receives a relatively non-delayed clock signal, and where the first circuit unit has a first circuit output connected to a second circuit input the second circuit unit, said method comprising the steps of:

generating an indicating signal that indicates receipt of the wire-length delayed clock signal by the second circuit unit;

transmitting the indicating signal to the first circuit unit; and inhibiting the first circuit output from changing until the indicating signal is received by the first circuit unit.

* * * * *